United States Patent
Chen et al.

(10) Patent No.: US 11,996,297 B2
(45) Date of Patent: May 28, 2024

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Chin-Ta Chen, Hsinchu (TW); Han-Wei Wu, Tainan (TW); Yuan-Hsiang Lung, Hsinchu (TW); Hua-Tai Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 66 days.

(21) Appl. No.: 17/713,993

(22) Filed: Apr. 5, 2022

(65) Prior Publication Data
US 2023/0049896 A1 Feb. 16, 2023

Related U.S. Application Data

(60) Provisional application No. 63/230,633, filed on Aug. 6, 2021.

(51) Int. Cl.
*H01L 21/32* (2006.01)
*H01L 21/027* (2006.01)
(Continued)

(52) U.S. Cl.
CPC ...... *H01L 21/3212* (2013.01); *H01L 21/0273* (2013.01); *H01L 21/28238* (2013.01)

(58) Field of Classification Search
CPC ............ H01L 21/3212; H01L 21/0273; H01L 21/28238; H01L 21/0334; H01L 21/0337; G03F 7/70633
(Continued)

(56) References Cited

U.S. PATENT DOCUMENTS 5,907,779 A * 5/1999 Choi ............... H10B 12/09 438/203
6,071,802 A * 6/2000 Ban .............. H10B 12/09 438/618
(Continued)

FOREIGN PATENT DOCUMENTS

CN 111978857 A * 11/2020 ............ C08J 7/0423

OTHER PUBLICATIONS

Filmetrics, Refractive Index of Polycrystalline Silicon (Year: 2022).*
(Continued)

*Primary Examiner* — Duy Vu N Deo
(74) *Attorney, Agent, or Firm* — STUDEBAKER & BRACKETT PC

(57) ABSTRACT

A method of manufacturing a semiconductor device includes forming an underlying structure in a first area and a second area over a substrate. A first layer is formed over the underlying structure. The first layer is removed from the second area while protecting the first layer in the first area. A second layer is formed over the first area and the second area, wherein the second layer has a smaller light transparency than the first layer. The second layer is removed from the first area, and first resist pattern is formed over the first layer in the first area and a second resist pattern over the second layer in the second area.

20 Claims, 17 Drawing Sheets

(51) Int. Cl.
*H01L 21/28* (2006.01)
*H01L 21/321* (2006.01)

(58) Field of Classification Search
USPC .......................................... 438/142–238, 692
See application file for complete search history.

(56) References Cited

U.S. PATENT DOCUMENTS

| | | |
|---|---|---|
| 8,796,666 B1 | 8/2014 | Huang et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | JangJian et al. |
| 9,882,023 B2 | 1/2018 | Lin et al. |
| 2011/0068384 A1* | 3/2011 | Kim .................... H10B 12/488 257/302 |
| 2014/0227839 A1* | 8/2014 | Shinohara ......... H01L 29/40117 438/261 |

OTHER PUBLICATIONS

Filmetrics, Refractive Index of SiO2, Fused Silica, Silica, Silicon Dioxide, Thermal Oxide, ThermalOxide (Year: 2022).*

* cited by examiner

METHOD OF MANUFACTURING A SEMICONDUCTOR DEVICE

RELATED APPLICATION

This application claims priority to U.S. Provisional Patent Application No. 63/230,633 filed Aug. 6, 2021, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. In the manufacturing operation, one or more planarization operations, such as a chemical mechanical polishing (CMP) process, are used to flatten a topography of a dielectric or conductive layer caused by underlying structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
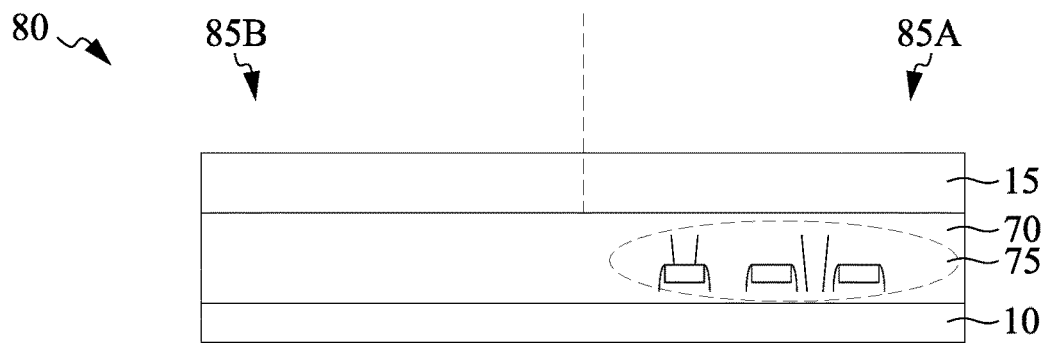
FIG. 1 shows a view of one of the sequential manufacturing process of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a method of manufacturing a semiconductor device, in particular, a field effect transistor (FET). The embodiments such as those disclosed herein are applicable to fin FETs (FinFETs), planar FETs, and gate-all-around FETs (GAA-FETs). In some embodiments, the embodiments disclosed herein are applicable to bipolar transistors. In some embodiments, the transistors disclosed herein can be used in a complementary metal oxide semiconductor (CMOS) device, an analog semiconductor device, a high-voltage semiconductor device, a bipolar CMOS (BiCMOS), and a CMOS image sensor.

As semiconductor devices become smaller, layer to layer overlay becomes more important due to the small process window. In high aspect ratio via patterning, a thicker hard mask is used for patterning. However, thicker hard masks, impact the overlay measurement quality because of the increased opacity of the thicker hard mask layers. To improve overlay quality, an additional operation of removing the hard mask layer over overlay marks may be performed prior to via patterning. However, this may create a large wafer topography difference between the overlay mark area and a circuit area on the substrate, which could increase defocus and patterning failure issues during via patterning. Embodiments of the disclosure provide improved overlay quality in high aspect ratio via patterning without patterning defects caused by uneven topography.

FIGS. 1-18 show views of various stages of a sequential manufacturing operation of a semiconductor device according to the present disclosure. It is understood that additional operations may be provided before, during, and after the processes shown by FIGS. 1-18, and some of the operations described below can be replaced or eliminated for additional embodiments of the method. The order of the operations/processes may be interchangeable.

In some embodiments, a structure 80 includes a semiconductor device layer 70, including one or more semiconductor devices 75, formed over a substrate 10. In some embodiments, the substrate 10 is a semiconductor wafer. For example, in some embodiments, the substrate 10 is, for example, a p-type silicon wafer with an impurity concentration in a range of about $1 \times 10^{15}$ cm$^{-3}$ to about $1 \times 10^{18}$ cm$^{-3}$. In other embodiments, the substrate 10 is an n-type silicon wafer with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on-insulator) substrate. Amorphous substrates, such as amorphous Si or amorphous SiC; or insulating material, such as silicon oxide may also be used as the substrate 10. The substrate 10 may include various regions that have been suitably doped with impurities (e.g., p-type or n-type conductivity). In some embodiments, the structure includes one or more circuit regions 85A, where the one or more semiconductor devices 75 are formed, and one or more overlay mark regions 85B. The one or more semiconductor devices 75 may include transistors, such as field effect transistors (FETs), bipolar junction transistors (BJTs), and insulated-gate bipolar transistors (IGBTs); resistors; capacitors; inductors; etc. The overlay mark regions 85B include overlay measurement patterns in some embodiments, and are used to ensure alignment of subsequently formed layers and structures over the semiconductor device layer 70.

A first insulating layer 15 is subsequently formed over the semiconductor device layer 70 and substrate 10 in some embodiments, as shown in FIG. 1. The first insulating layer 15 includes one or more layers of insulating materials such as silicon oxide, silicon oxynitride, silicon nitride, SiOC, SiCN or SiOCN. The first insulating layer 15 can be formed by any suitable operation, including chemical vapor deposition (CVD), physical vapor deposition (PVD), and atomic layer deposition (ALD).

Figure 2:
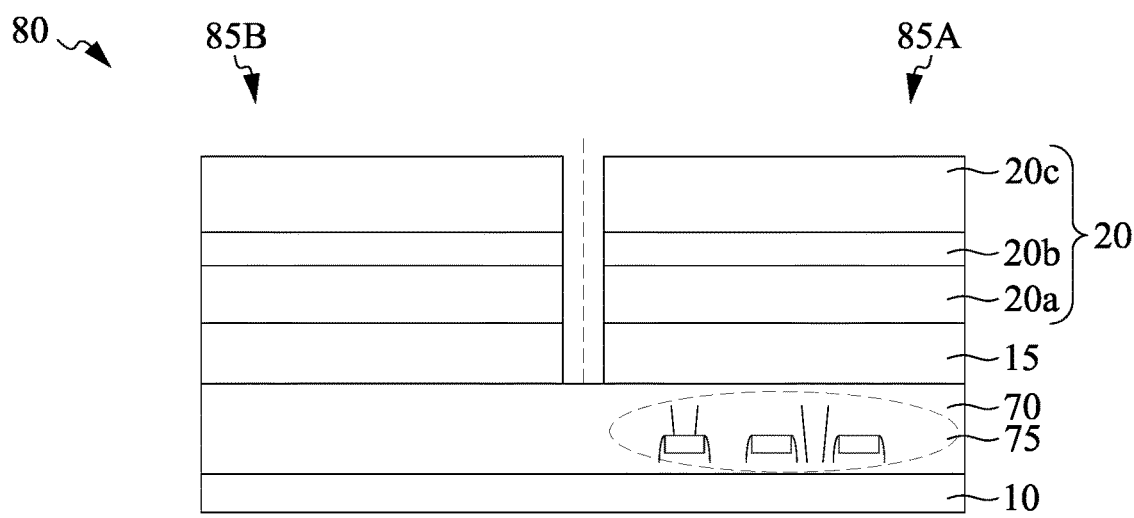
FIG. 2 shows a view of one of the sequential manufacturing process of a semiconductor device according to an embodiment of the present disclosure.

A first resist layer 20 is subsequently formed over the insulating layer 15. In some embodiments, the first resist layer 20 is a tri-layer resist layer including a bottom layer 20a, a middle layer 20b, and a top layer 20c, as shown in FIG. 2. In some embodiments, the bottom layer 20a is an organic material having a substantially planar upper surface, and the middle layer 20b is an anti-reflective layer. In some embodiments, the organic material of the bottom layer 20a includes a plurality of monomers or polymers that are not cross-linked. In some embodiments, the bottom layer 20a contains a material that is patternable and/or has a composition tuned to provide anti-reflection properties. Exemplary materials for the bottom layer 20a include carbon backbone polymers. The bottom layer 20a is used to planarize the structure, as the underlying structure may be uneven depending on the structure of devices in an underlying device layer. In some embodiments, the bottom layer 20a is formed by a spin coating process. In certain embodiments, the thickness of the bottom layer 20a ranges from about 50 nm to about 500 nm.

The middle layer 20b of the tri-layer resist structure may have a composition that provides anti-reflective properties for the photolithography operation and/or hard mask properties. In some embodiments, the middle layer 20b includes a silicon-containing layer (e.g., a silicon hard mask material). The middle layer 20b may include a silicon-containing inorganic polymer. In other embodiments, the middle layer 20b includes a siloxane polymer. In other embodiments, the middle layer 20b includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 20b may be bonded to adjacent layers, such as by covalent bonding, hydrogen bonding, or hydrophilic-to-hydrophilic forces. In some embodiments, the middle layer 20b has a thickness ranging from about 20 nm to about 100 nm.

The top layer 20c is a photoresist layer and may be composed of any suitable photoresist composition, including a metal-containing photoresist and a chemically amplified resist. In some embodiments, photoresists used in the top layer 20c include a polymer along with one or more photoactive compounds (PACs) in a solvent. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer having acid labile groups selected from the following:

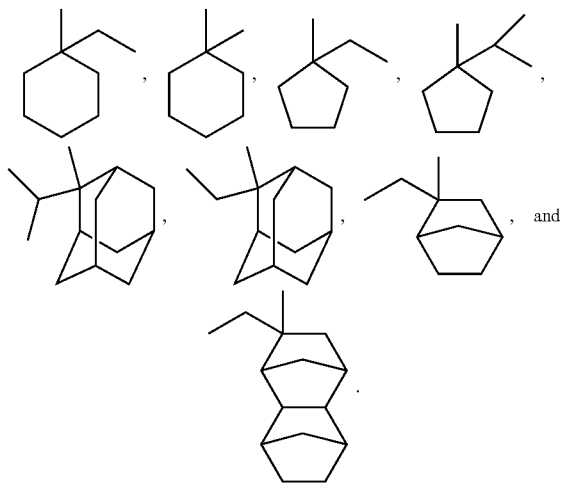

In some embodiments, the PACs include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

In some embodiments, the photoresist is a metal-containing photoresist. The photoresist layer 20c is made of a photoresist composition, including a first compound or a first precursor and a second compound or a second precursor combined in a vapor state. The first precursor or first compound is an organometallic having a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \le a \le 2$, $b \ge 1$, $c \ge 1$, and $b+c \le 5$ in some embodiments. In some embodiments, the alkyl, alkenyl, or carboxylate group is substituted with one or more fluoro groups. In some embodiments, the organometallic precursor is a dimer, where each monomer unit is linked by an amine group. Each monomer has a formula: $M_aR_bX_c$, as defined above.

In some embodiments, R is alkyl, such as $C_nH_{2n+1}$ where $n \ge 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

In some embodiments, the first organometallic compound or first organometallic precursor includes a metallic core $M^+$ with ligands L attached to the metallic core $M^+$. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the thickness of the photoresist layer 20c ranges from about 10 nm to about 100 nm. In other embodiments, the thickness of the photoresist layer 20c ranges from about 15 nm to about 80 nm. In other embodiments, the thickness of the photoresist layer 20c ranges from about 20 nm to about 60 nm. If the thickness of the photoresist layer 20c is less than the disclosed ranges it may not provide sufficient coverage of the underlying layers. If the thickness of the photoresist layer 20c is greater than the disclosed range it may not provide significantly improved coverage and may be more difficult to accurately pattern.

Figure 3:
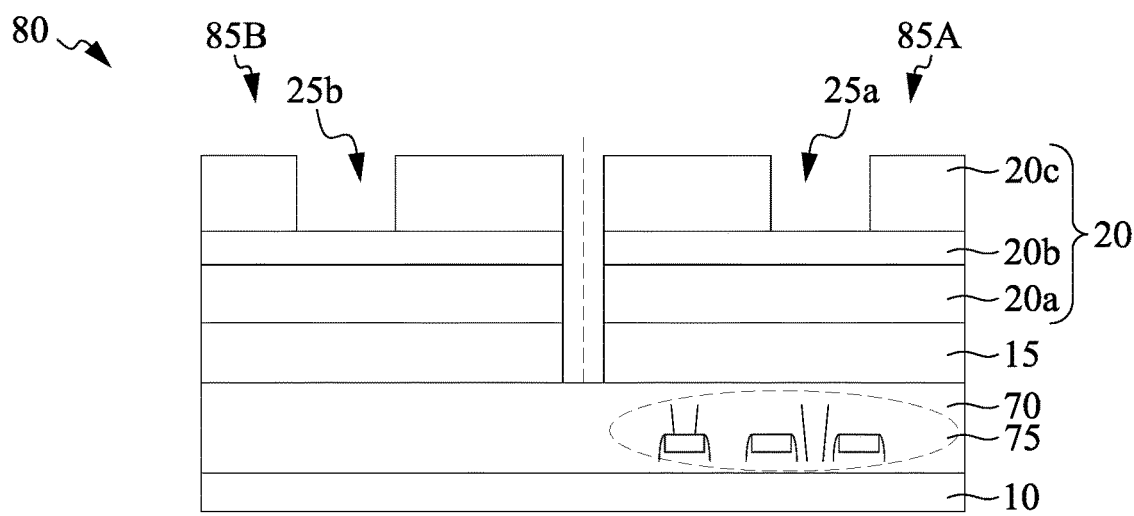
FIG. 3 shows a view of one of the sequential manufacturing process of a semiconductor device according to an embodiment of the present disclosure.

The top (photoresist) layer 20c is subsequently photolithographically patterned to form openings 25a and 25b in the circuit region and overlay mask region, respectively, as shown in FIG. 3. The photoresist layer 20c is selectively exposed to actinic radiation to form a latent pattern. In some embodiments, the photoresist layer 20c is selectively exposed to ultraviolet radiation. In some embodiments, the ultraviolet radiation is deep ultraviolet (DUV) radiation. In some embodiments, the ultraviolet radiation is extreme ultraviolet (EUV or XUV) radiation. EUV and XUV are used interchangeably in this disclosure. In some embodiments, the radiation is an electron beam.

After a post exposure bake (PEB) at a temperature of about 50° C. to about 250° C. for about 20 seconds to about 300 seconds, the selectively exposed photoresist layer 20c is developed to form openings 25a, 25b, as shown in FIG. 3, in some embodiments. In some embodiments, a developer is applied to the photoresist layers using a spin-on process. In the spin-on process, the developer is applied to the photoresist layer 20c from above the photoresist layer 20c while the photoresist coated substrate is rotated. While the spin-on operation is one suitable method for developing the photoresist layer 20c after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 4:
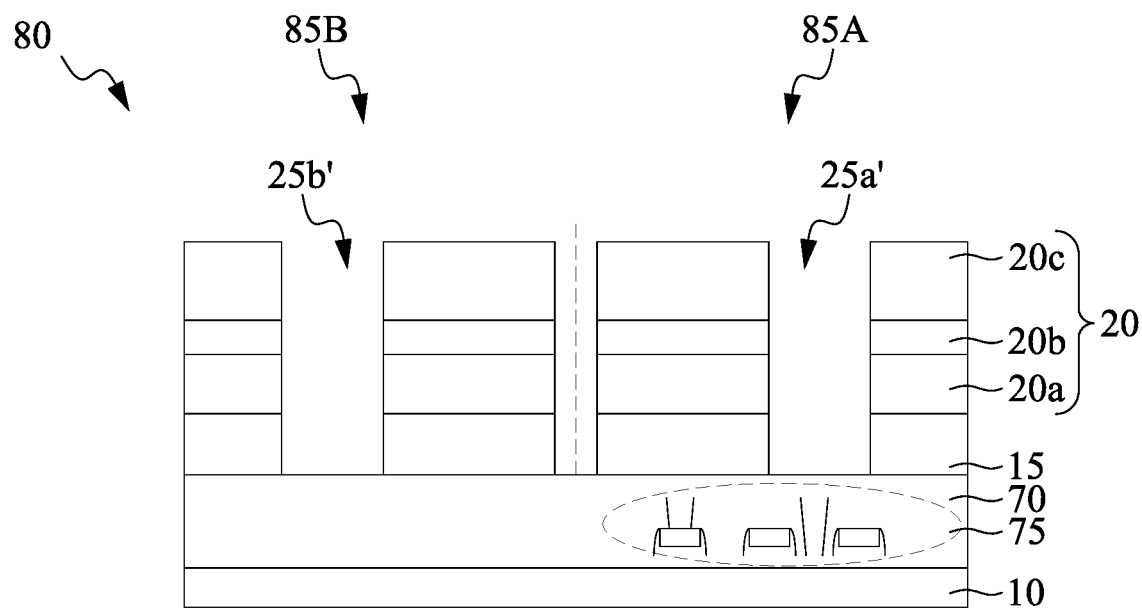
FIG. 4 shows a view of one of the sequential manufacturing process of a semiconductor device according to an embodiment of the present disclosure.

Using the patterned photoresist layer 20c as a mask, the openings 25a, 25b in the photoresist layer 20c are extended into through the middle layer 20b, bottom layer 20a, and the insulating layer 15 using suitable etching operations to form extended openings 25a' and 25b', as shown in FIG. 4. The etchants used in the etching operations are selective to the specific layer being etched in some embodiments. A combination of wet etching and dry etching operations are used in some embodiments. In some embodiments, different etchants are used to etch the middle layer 20b, the bottom layer 20a, and the insulating layer 15.

Figure 5:
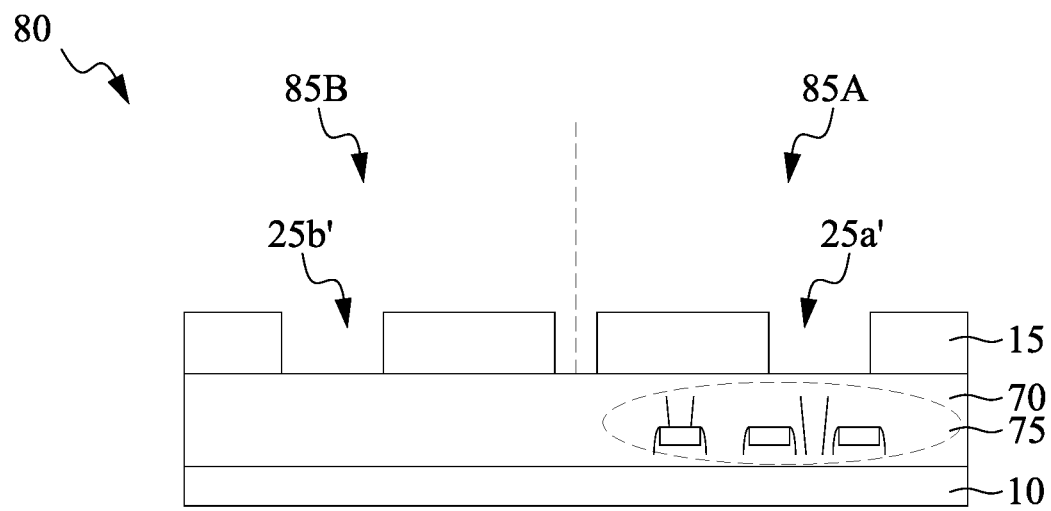
FIG. 5 shows a view of one of the sequential manufacturing process of a semiconductor device according to an embodiment of the present disclosure.

After extending the openings 25a' and 25b' through the insulating layer 15, the photoresist layer 20c, middle layer 20b, and the bottom layer 20a, are removed, as shown in FIG. 5, in some embodiments. The photoresist layer 20c may be removed by a suitable photoresist stripping or photoresist ashing operation. In some embodiments, the middle layer 20b, and bottom layer 20a are removed during the photoresist stripping, photoresist ashing, or substrate etching operation. In some embodiments, different etching operations using different etchants are performed to remove each of the middle layer 20b and the bottom layer 20a.

Figure 6:
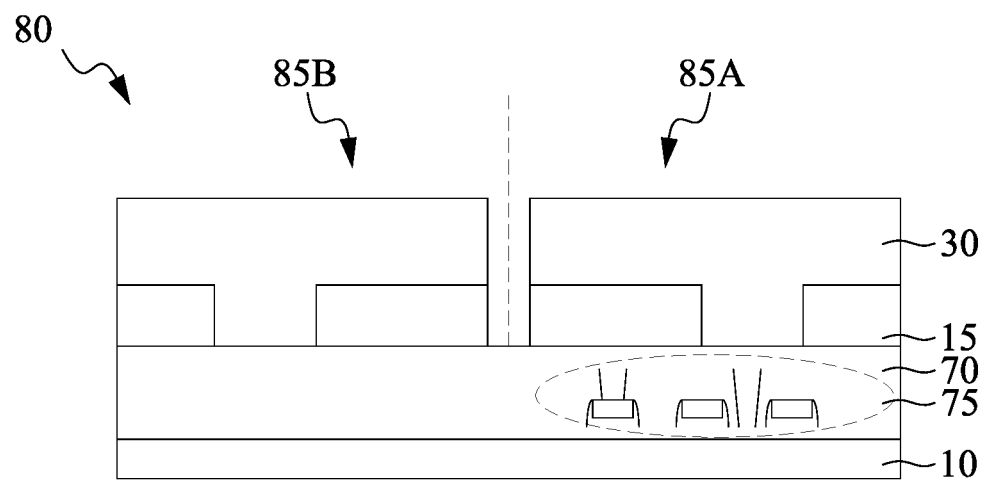
FIG. 6 shows a view of one of the sequential manufacturing process of a semiconductor device according to an embodiment of the present disclosure.

A conductive layer 30 is then formed over the insulating layer 15 filling the openings 25a' and 25b', as shown in FIG. 6. The conductive layer 30 includes one or more layers of any suitable metal material, such as aluminum, copper, titanium, tantalum, cobalt, molybdenum, tungsten, tantalum nitride, nickel silicide, cobalt silicide, TiN, WN, TiAl, TiAlN, TaCN, TaC, TaSiN, metal alloys, other suitable materials, and/or combinations thereof. The conductive layer is formed by any suitable operation, including electro or electroless plating, CVD, PVD including sputtering, ALD, thermal evaporation, or electron beam evaporation.

Figure 7:
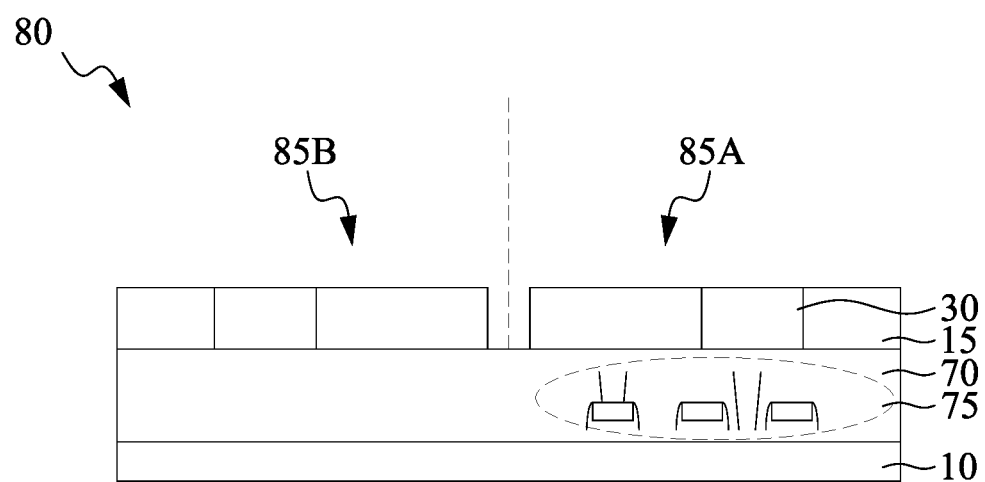
FIG. 7 shows a view of one of the sequential manufacturing process of a semiconductor device according to an embodiment of the present disclosure.
Figure 8:
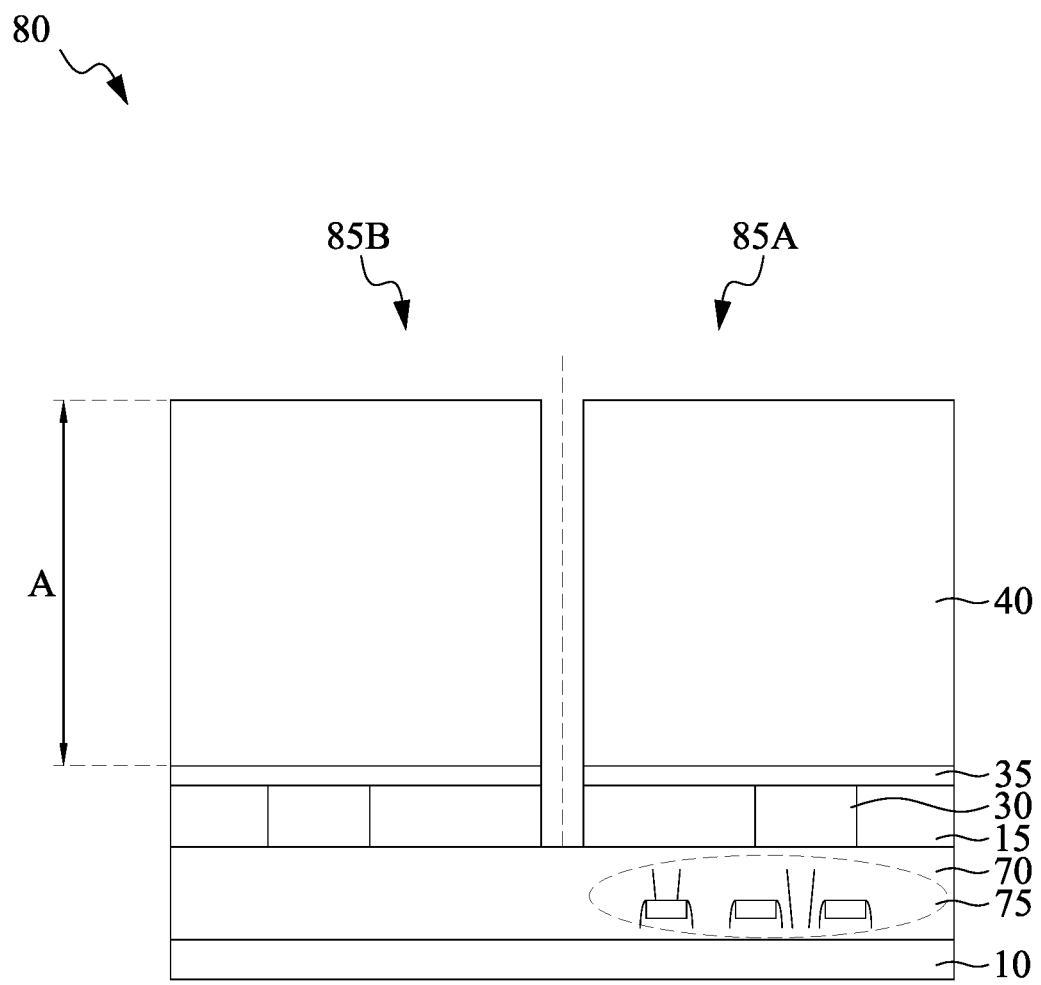
FIG. 8 shows a view of one of the sequential manufacturing process of a semiconductor device according to an embodiment of the present disclosure.

Then, a planarization operation is performed to remove an excess portion of the conductive layer 30, to form one or more wiring layers including conductive contacts 30 overlying the wiring region 85A and the overlay mark region 85B, as shown in FIG. 7. In some embodiments, a CMP operation is performed. After the planarization operation, the top of the conductive contacts 30 and the top of the insulating layer 15 are substantially coplanar.

In some embodiments, an etch stop layer 35 and a second insulating layer 40 are subsequently formed over the conductive layer 30 and the insulating layer 15. In some embodiments, the second insulating layer 40 includes one or more layers of insulating materials, such as silicon oxide, silicon oxynitride, silicon nitride, SiOC, SiCN or SiOCN. The etch stop layer 35 may include any known etch stop material, including a silicon oxide, silicon nitride, silicon oxynitride, aluminum oxide, aluminum nitride, aluminum fluoride, tantalum oxide, and magnesium fluoride. The second insulating layer 40 and etch stop layer 35 may be formed by any suitable method, including CVD, plasma enhanced CVD (PECVD), ALD, and a PVD operation, such as sputtering. In some embodiments, the second insulating layer 40 and the etch stop layer 35 are formed of different materials. In some embodiments, the second insulating layer has a thickness A ranging from about 0.25 µm to about 4 µm, and from about 0.7 µm to about 2.5 µm in other embodiments. In some embodiments, the etch stop layer 35 has a thickness ranging from about 10 nm to about 100 nm, and from about 20 nm to 80 nm in other embodiments.

Figure 9:
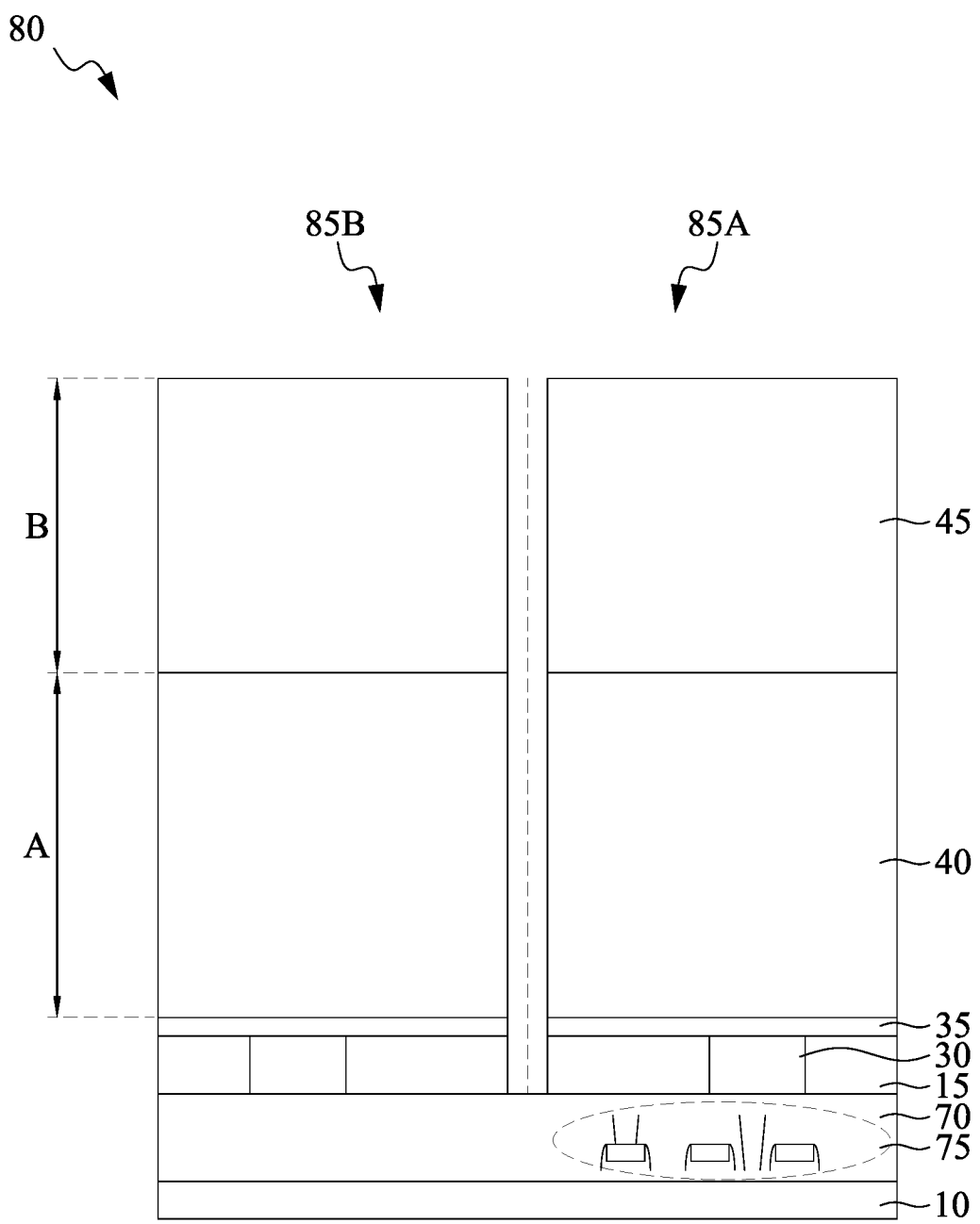
FIG. 9 shows a view of one of the sequential manufacturing process of a semiconductor device according to an embodiment of the present disclosure.

A sacrificial layer 45 is subsequently formed over the second insulating layer 40, as shown in FIG. 9. In some embodiments, the sacrificial layer 45 is made of a different material than the second insulating layer 40. In some embodiments, the sacrificial layer 45 is made of an amorphous silicon oxide or silicon nitride having a low coefficient of extinction. In other embodiments, the sacrificial layer 45 is made of a silicon oxycarbide, a silicon oxynitride, aluminum nitride, aluminum oxide, or aluminum oxynitride. In some embodiments the coefficient of extinction of the sacrificial layer 45 ranges from about 0.001 to about 0.1. In some embodiments, the sacrificial layer 45 has a lower coefficient of extinction (or higher light transparency) than the second insulating layer 40. In some embodiments, the sacrificial layer 45 is substantially transparent. The sacrificial layer 45 may be formed by any suitable method, including CVD, plasma enhanced CVD (PECVD), ALD, and a PVD operation, such as sputtering.

In some embodiments, the sacrificial layer 45 has a thickness B ranging from about 0.2 µm to about 5 µm, and from about 0.5 µm to about 2 µm in other embodiments. In some embodiments, a ratio of thicknesses of the sacrificial layer 45 (B) to the second insulating layer 40 (A) ranges from about 0.2 to about 1.5, and in other embodiments, the ratio of thicknesses of the sacrificial layer 45 to the second insulating layer 40 ranges from about 0.4 to about 0.9. Thickness ratios B/A less than or greater than the disclosed ratios may not provide a satisfactory topography difference between the overlay mark region and the circuit region. In some embodiments, the second insulating layer 40 and the sacrificial layer 45 are formed of different materials, in other embodiments, they are formed of the same material.

Figure 10:
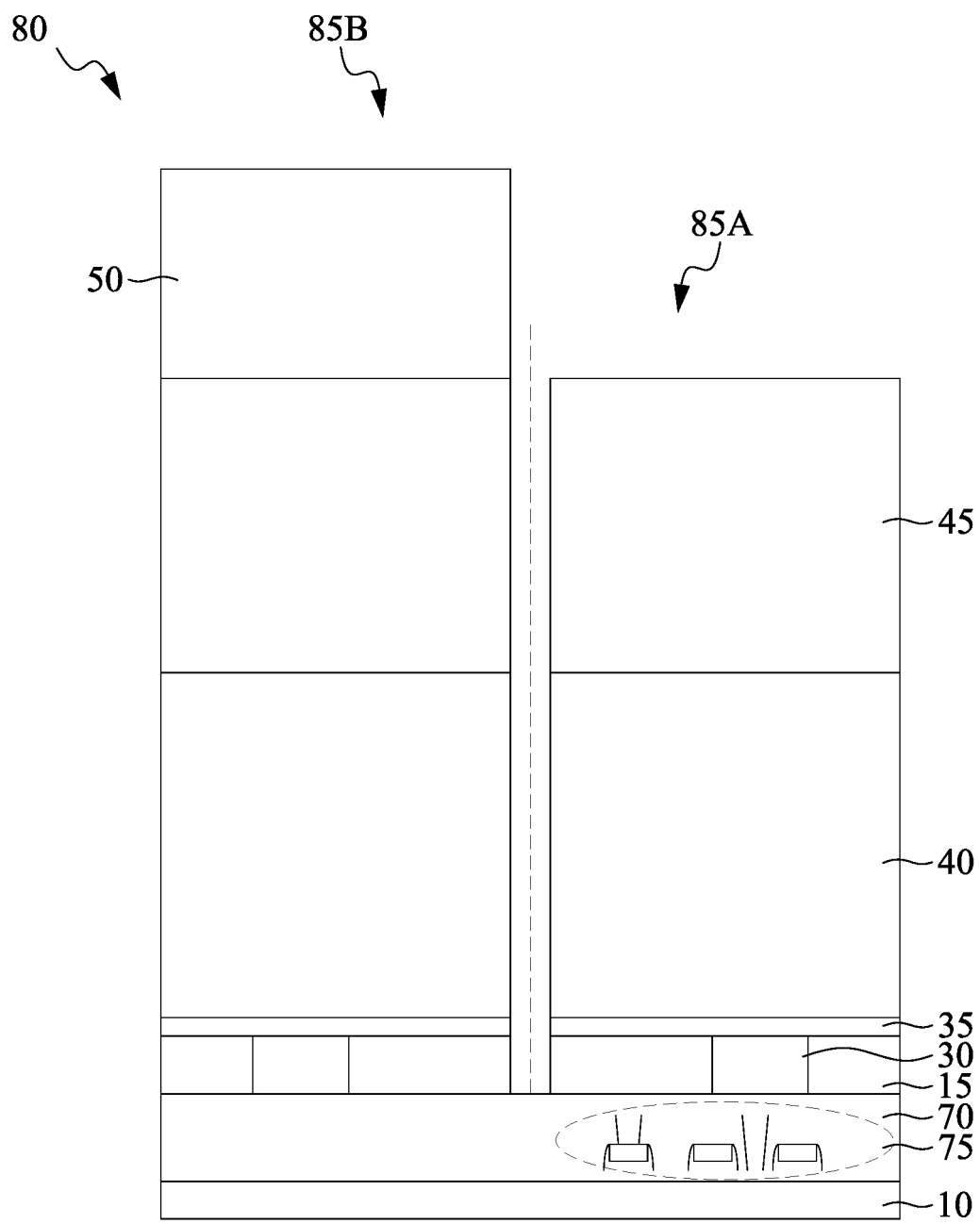
FIG. 10 shows a view of one of the sequential manufacturing process of a semiconductor device according to an embodiment of the present disclosure.

A second photoresist layer 50 is subsequently formed over the sacrificial layer 45, as shown in FIG. 10. The photoresist layer 50 may be any of formed of any suitable photoresist material disclosed herein. Photolithographic patterning is used to remove the photoresist layer 50 overlying the circuit region 85A.

Figure 11:
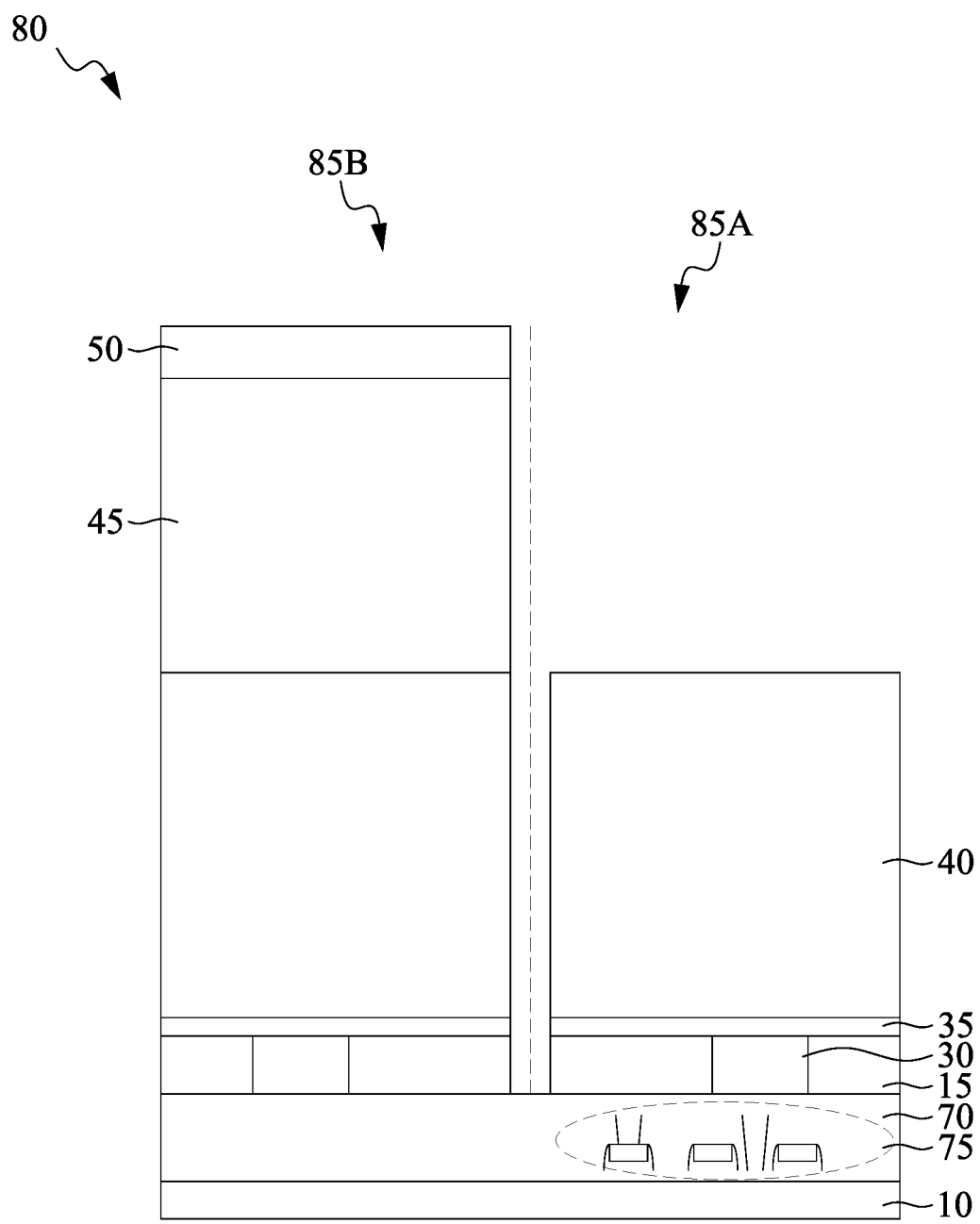
FIG. 11 shows a view of one of the sequential manufacturing process of a semiconductor device according to an embodiment of the present disclosure.
Figure 12:
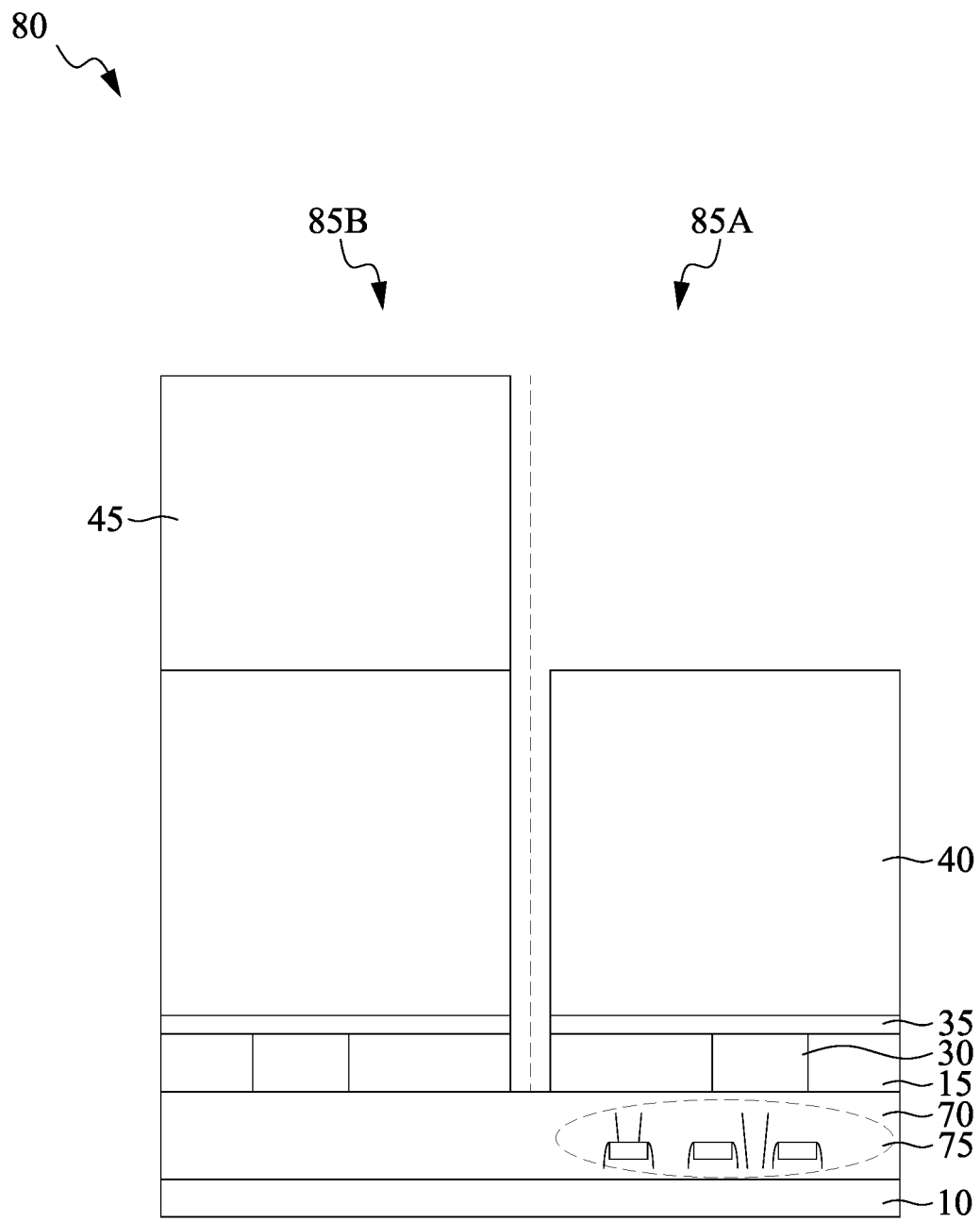
FIG. 12 shows a view of one of the sequential manufacturing process of a semiconductor device according to an embodiment of the present disclosure.

Next the sacrificial layer 45 overlying the circuit region 85A is removed by a suitable etching operation, as shown in FIG. 11. The etching operation may be a wet etching operation or a dry etching operation. In some embodiments, a portion of the second photoresist layer 50 overlying the sacrificial layer 45 in the overlay mark region 85B is removed during the etching operation. After the removal of the sacrificial layer 45 in the circuit region 85A, any remaining portions of the second photoresist layer 50 in the overlay mark region 85 is removed by a suitable photoresist stripping or etching operation, as shown in FIG. 12.

Figure 13:
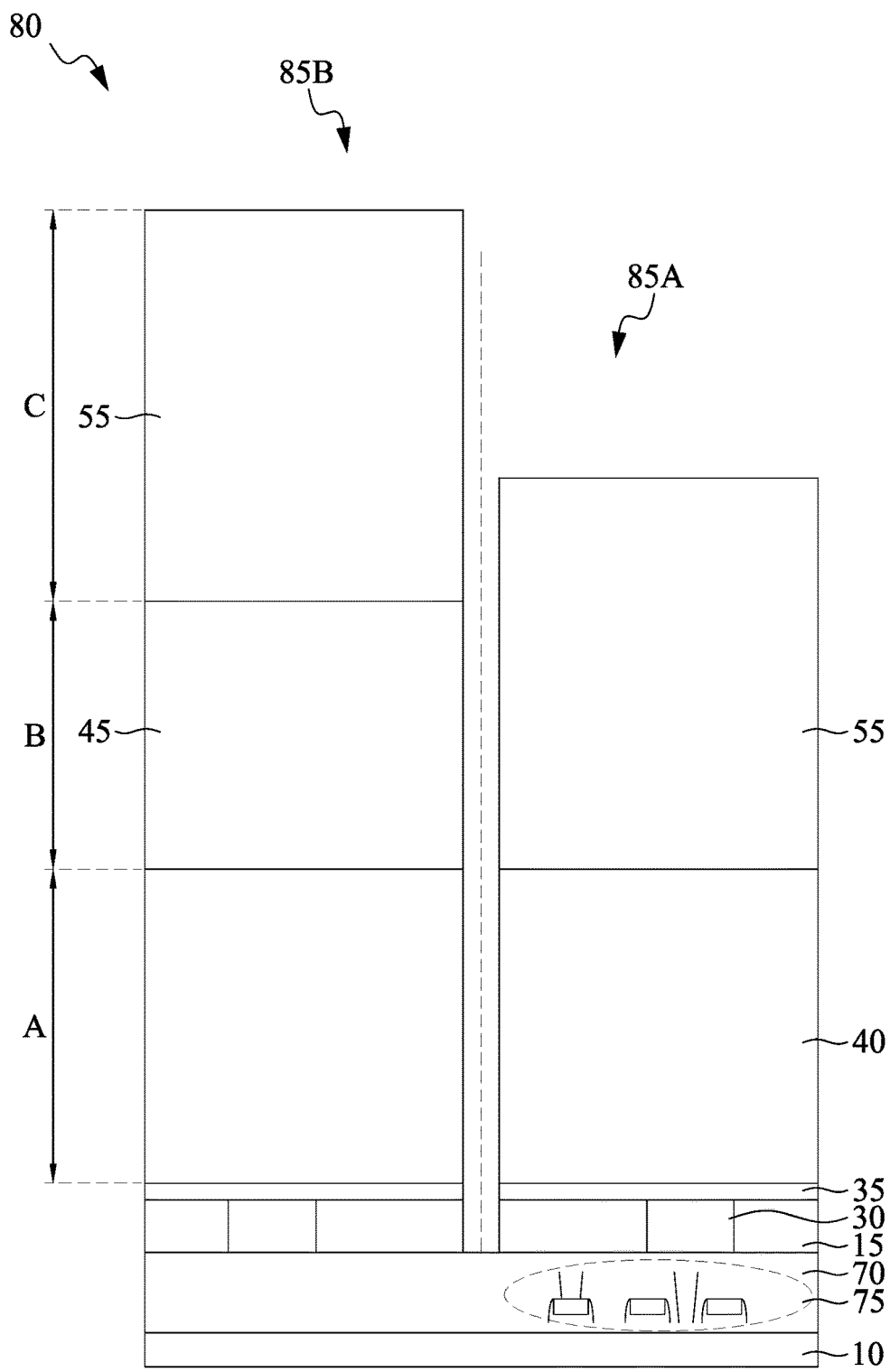
FIG. 13 shows a view of one of the sequential manufacturing process of a semiconductor device according to an embodiment of the present disclosure.

A hard mask layer 55 is then formed over the sacrificial layer 45 and the second insulating layer 40, as shown in FIG. 13. The hard mask layer 55 has a higher coefficient of extinction than the sacrificial layer 45 in some embodiments. The hard mask layer 55 is a substantially opaque material different than the sacrificial layer 45. In some embodiments, the hard mask layer 55 includes amorphous carbon, silicon (amorphous or polysilicon), a silicon nitride, a silicon oxide, or SiOC. In some embodiments, the hard mask layer 55 includes a metal, such as a metal oxide or a metal nitride. In some embodiments, the metal oxide or metal nitride includes titanium nitride, or aluminum oxide. The hard mask layer 55 may be formed by any suitable method, including CVD, plasma enhanced CVD (PECVD), ALD, and a PVD operation, such as sputtering. In some embodiments, the hard mask layer 55 has a smaller light transparency (or higher extinction coefficient) than the sacrificial layer 45.

In some embodiments, the hard mask layer 55 has a thickness C ranging from about 0.2 μm to about 5 μm, and from about 0.6 μm to about 2.1 μm in other embodiments. In some embodiments, a ratio of thicknesses of the hard mask layer 55 (C) to the sacrificial layer 45 (B) ranges from about 0.3 to about 4.2, and in other embodiments ranges from about 0.75 to about 2.5. Thickness ratios C/B less than or greater than the disclosed ratios may not provide a satisfactory topography difference between the overlay mark region and the circuit region. In some embodiments, a ratio of thicknesses of the hard mask layer 55 (C) to the second insulating layer 40 (A) ranges from about 0.25 to about 0.85, and in other embodiments ranges from about 0.5 to about 0.85. Thickness ratios C/A less than or greater than the disclosed ratios may not provide a satisfactory topography difference between the overlay mark region and the circuit region.

Figure 14:
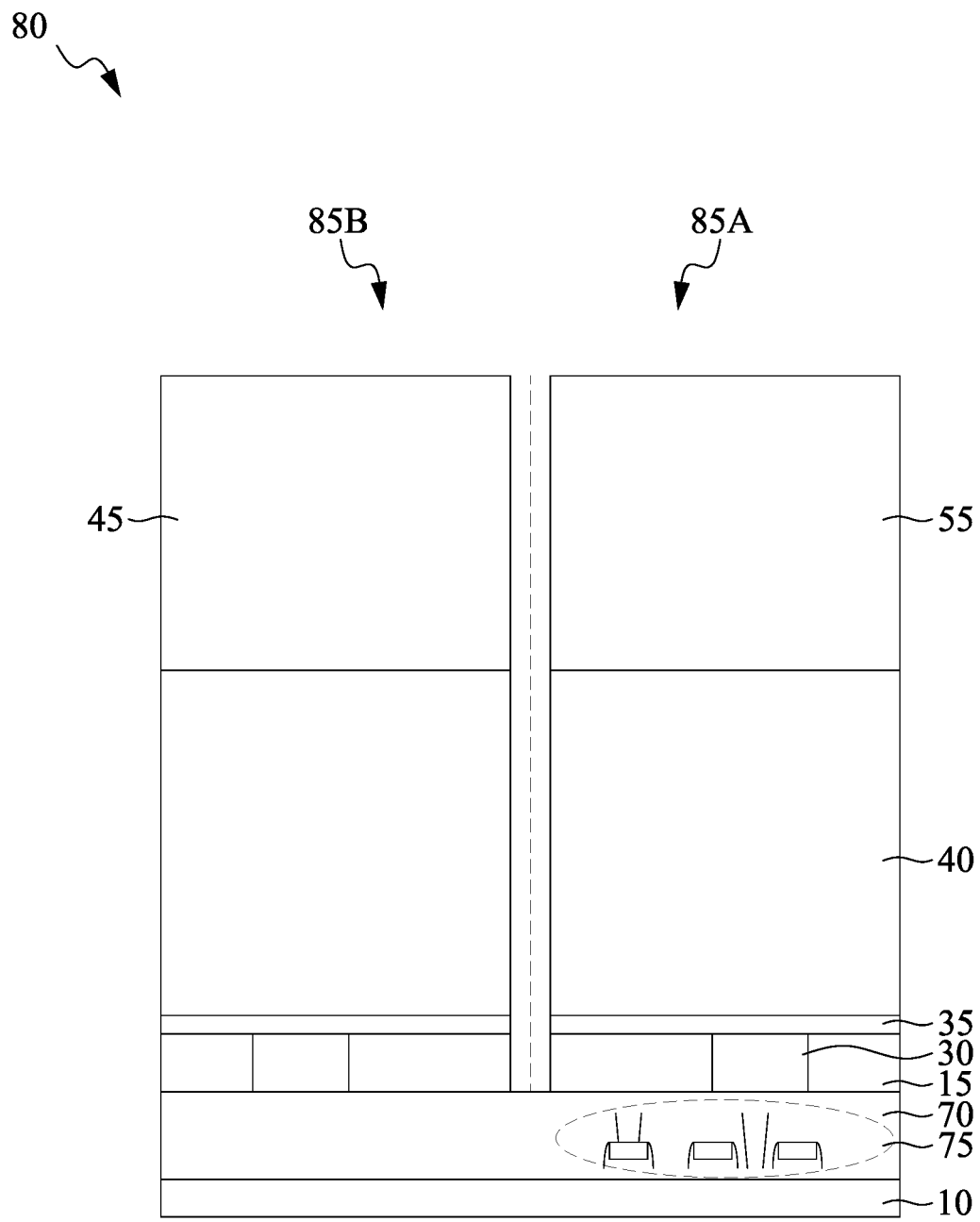
FIG. 14 shows a view of one of the sequential manufacturing process of a semiconductor device according to an embodiment of the present disclosure.

Then, using a CMP operation or an etch back operation, the hard mask layer 55 is planarized so that it is substantially coplanar with the uppermost surface of the sacrificial layer 45, as shown in FIG. 14. In some embodiments, a difference between a level of the uppermost surface of the hard mask layer 55 overlying the circuit region 85A and a level of the uppermost surface of the sacrificial layer 45 is less than 0.5 μm, in other embodiments, the difference is less than 0.1 μm. In some embodiments, the difference is more than zero.

Figure 15:
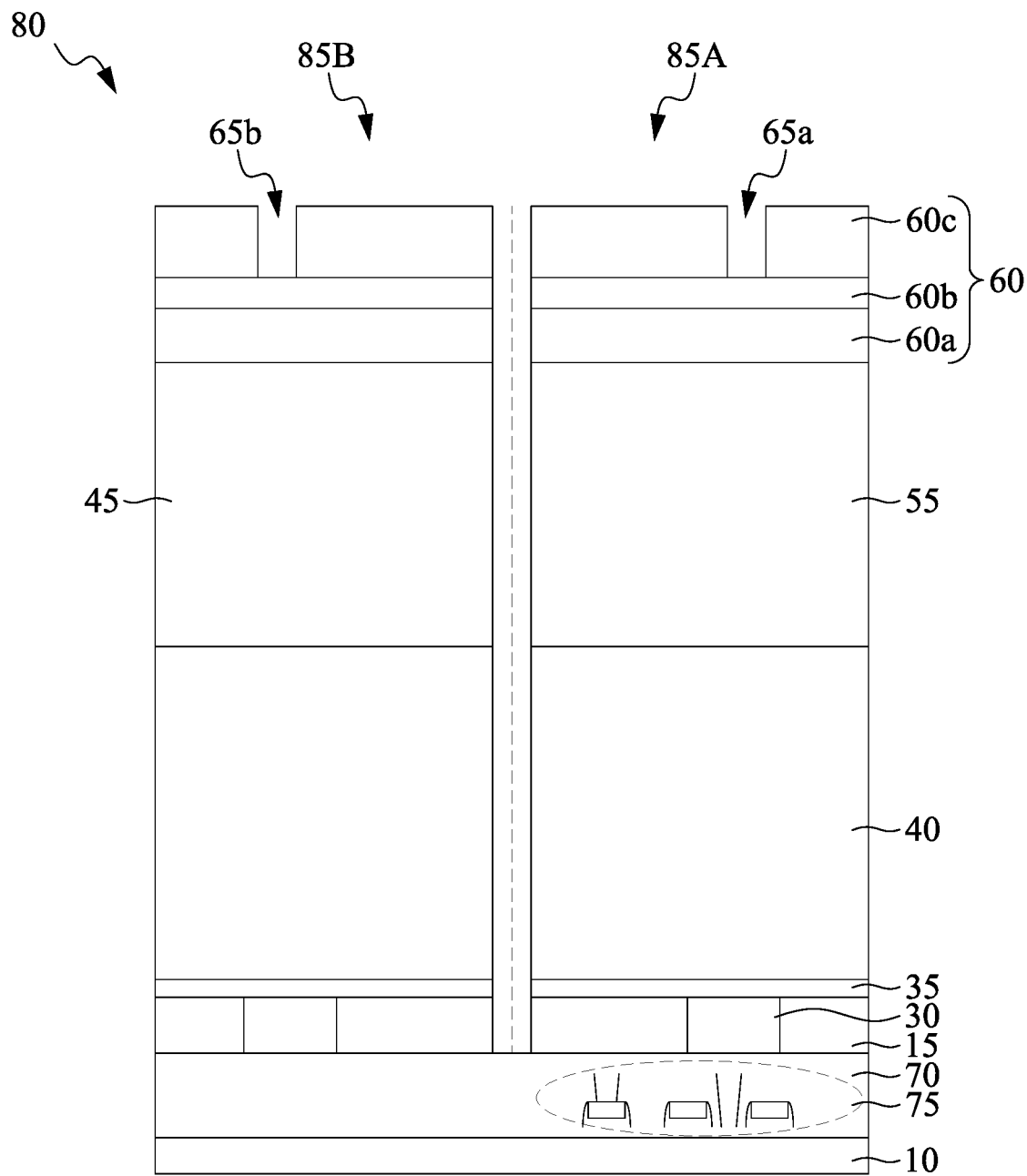
FIG. 15 shows a view of one of the sequential manufacturing process of a semiconductor device according to an embodiment of the present disclosure.

Because of the small difference between the level of the top surface of the sacrificial layer 45 in the overlay mark region 85B and the level of the top surface of hard mask layer 55 in the circuit region 85A, a subsequently formed third resist layer 60 will have a substantially even surface, as shown in FIG. 15. In some embodiments, the resist layer 60 is a tri-layer resist including a photoresist layer 60c, a middle layer 60b, and bottom layer 60a. The tri-layer resist is formed of any of the materials, and by any of the methods disclosed herein. Because the photoresist layer 60c is substantially even across the structure 80, a subsequent selective exposure of the photoresist layer 60c will be in focus in both the overlay mark region 85B and the circuit region 85A, and patterns 65a, 65b formed in the photoresist layer 60 in both regions will be accurately formed, with improved and consistent line width roughness (LWR).

Further, in some embodiments, an overlay error measurement between the underlying pattern 30 in the overlay mark region 85B and the resist pattern 65b is performed after the resist patterns are formed. Since no opaque hard mask layer 55 is disposed below the resist pattern 65b, an overlay error measurement using an optical measurement tool is more accurately and correctly performed compared with the case where an opaque hard mask layer 55 is disposed (instead of the sacrificial layer 45) below the resist pattern 65b.

Figure 16:
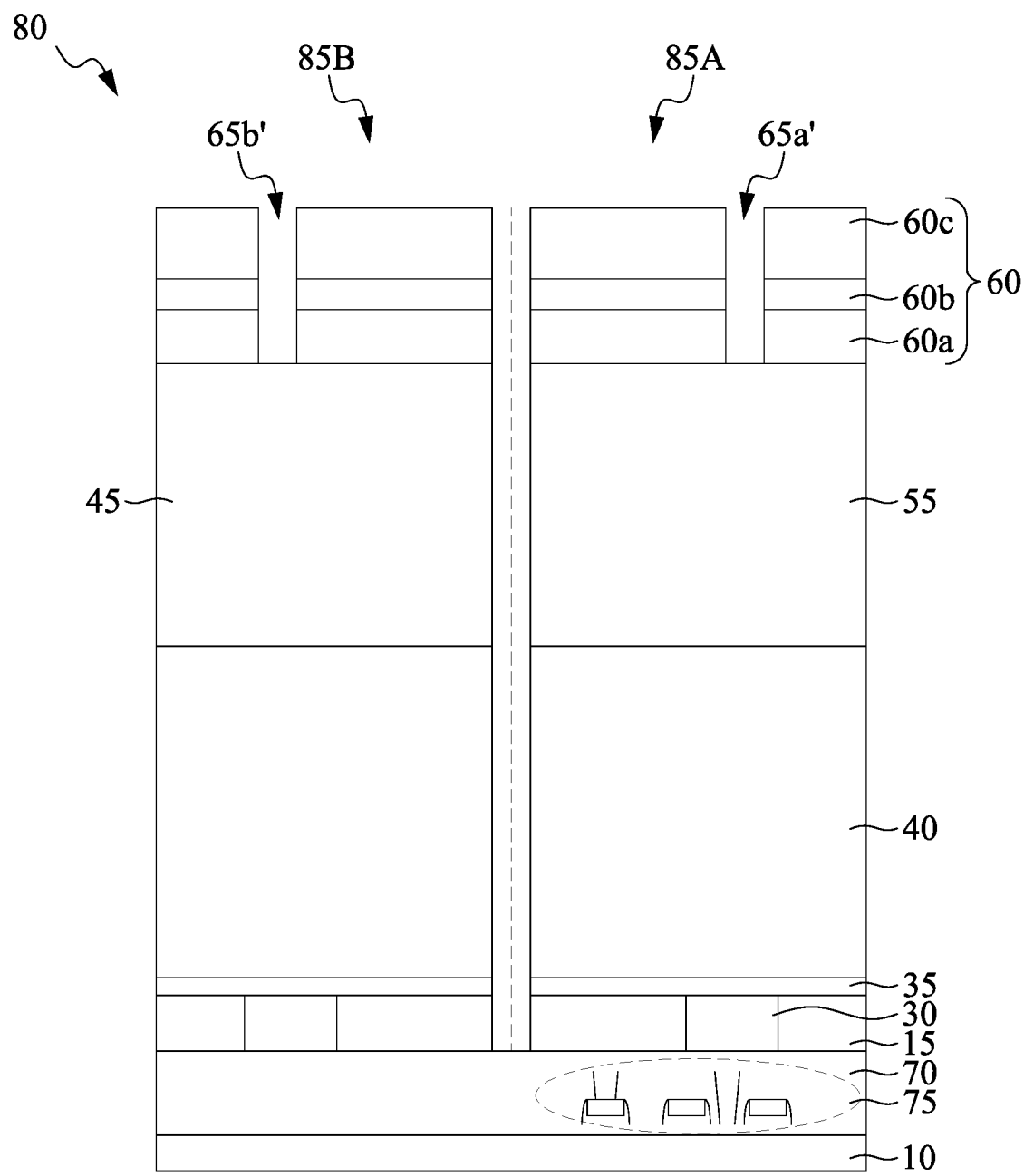
FIG. 16 shows a view of one of the sequential manufacturing process of a semiconductor device according to an embodiment of the present disclosure.
Figure 17:
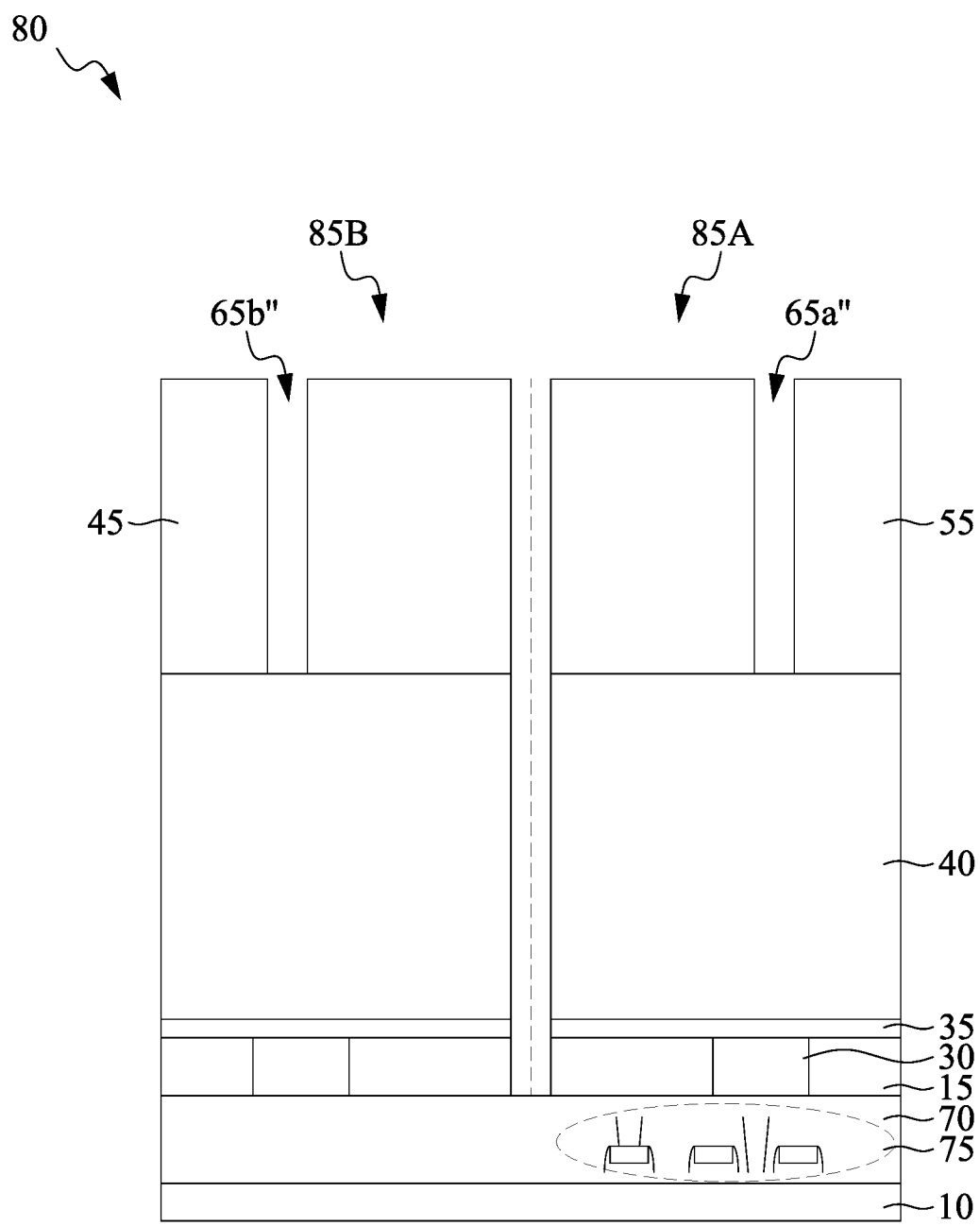
FIG. 17 shows a view of one of the sequential manufacturing process of a semiconductor device according to an embodiment of the present disclosure.

In subsequent processing operations, the pattern 65a', 65b' in the photoresist layer 60c is extended into the middle layer 60b and the bottom layer 60a using etching operations disclosed herein forming patterns 65a' and 65b' in the middle layer 60b and bottom layer 60a, as shown in FIG. 16. Then, the pattern in the 65a', 65b' in the middle layer 60b and bottom layer 60a is extended into the sacrificial layer 45 and the hard mask layer 55, respectively, using etching operations disclosed herein and the resist layer 60 is removed using stripping and etching operations disclosed herein forming patterns 65a", 65b" in the sacrificial layer 45 and the hard mask layer 55, as shown in FIG. 17. In some embodiments, the pattern 65b" is not formed or stops at the middle of the sacrificial layer 45, due to an etching selectivity difference between the sacrificial layer 45 and the hard mask layer 55.

Figure 18:
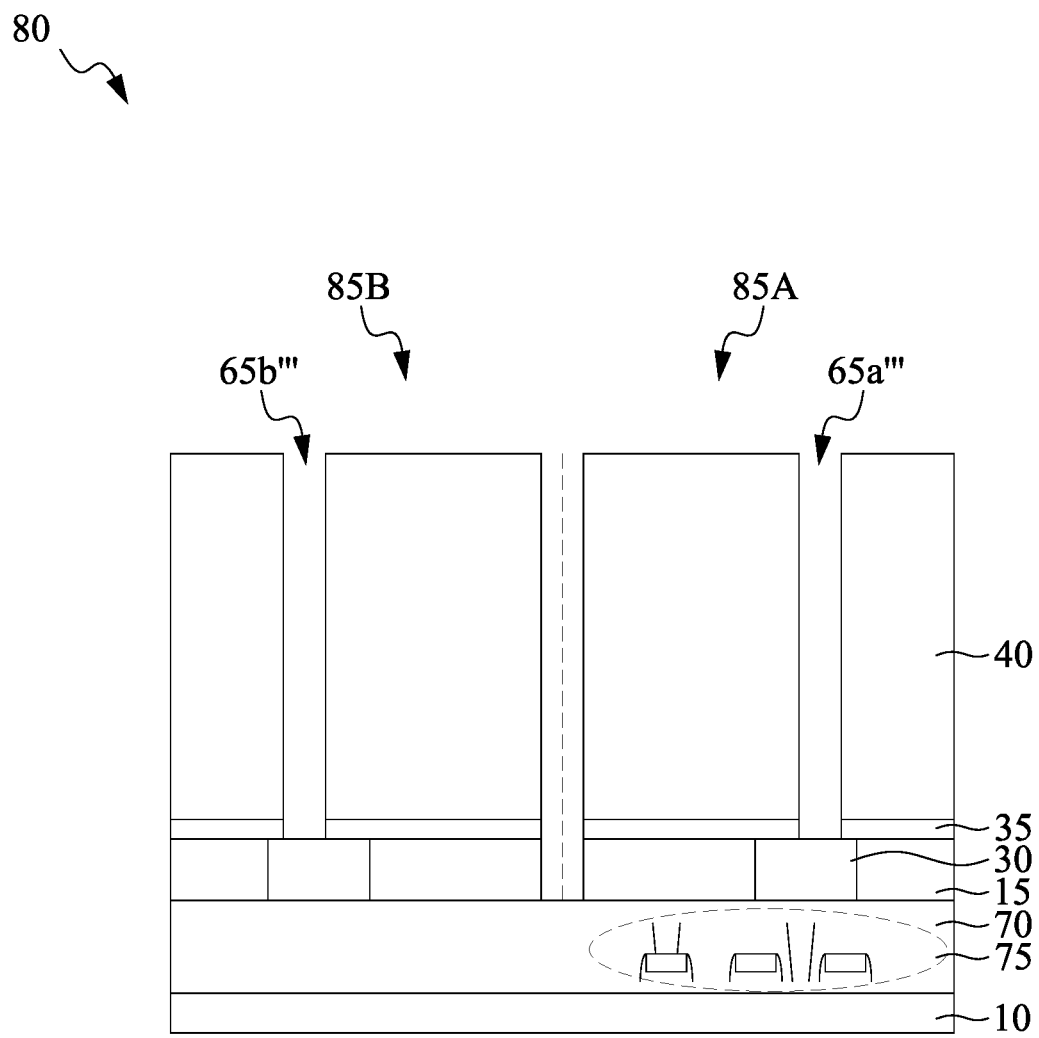
FIG. 18 shows a view of one of the sequential manufacturing process of a semiconductor device according to an embodiment of the present disclosure.

The patterns 65a", 65b" in the sacrificial layer 45 and hard mask layers 55, respectively, are subsequently extended into the second insulating layer 40 and the etch stop layer 35 in some embodiments using etching operations disclosed herein forming patterns 65a'", 65b'" in circuit region 85A and overlay mask area 85B, respectively, and the sacrificial layer 45 and hard mask layer 55 are removed using one or more suitable etching operations, as shown in FIG. 18.

Subsequent operations including filling the patterns 65a'", 65b'" with a conductive material to form conductive vias in some embodiments.

Figure 19:
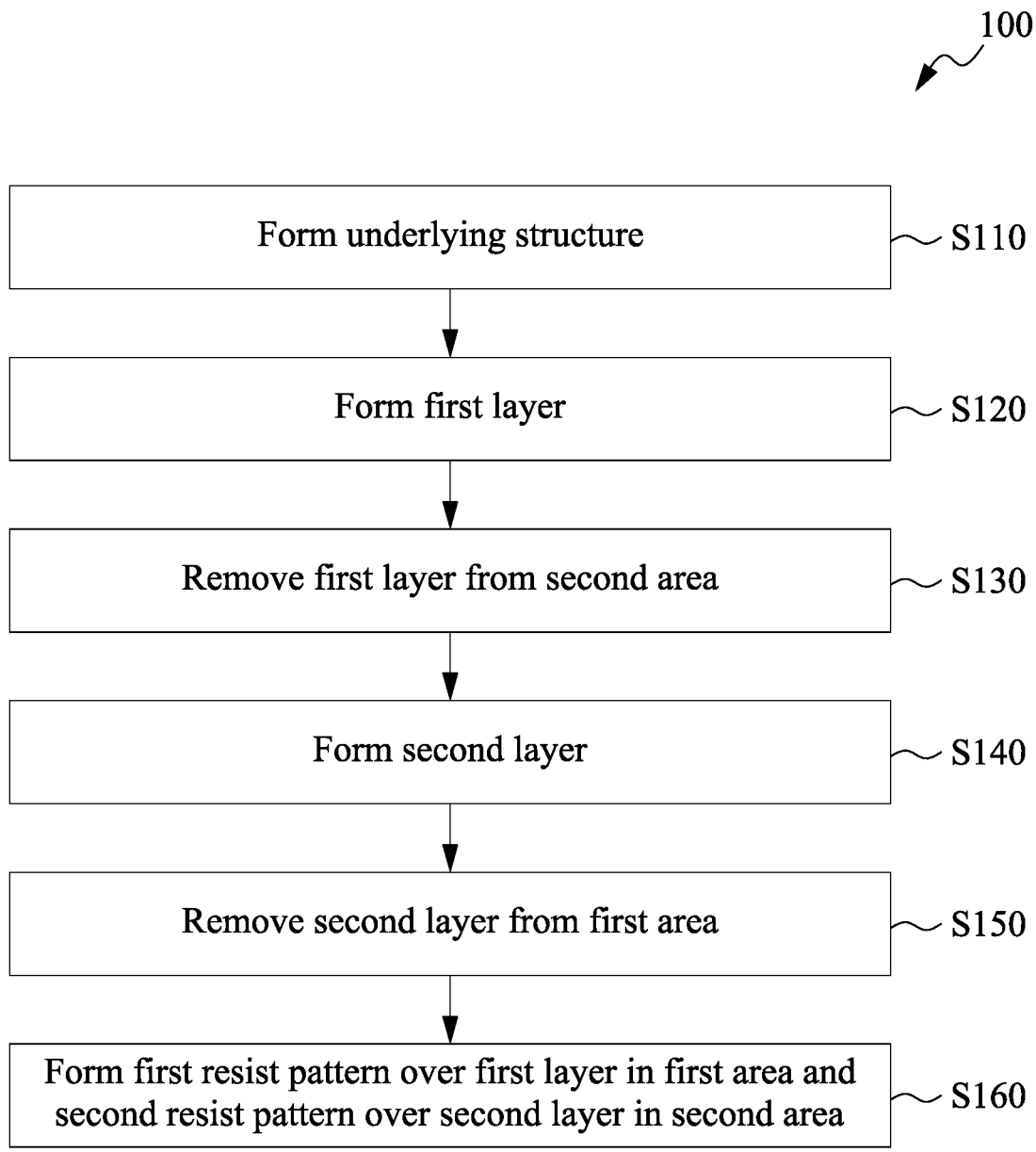
FIG. 19 shows a flowchart of a method of manufacturing a semiconductor device according to an embodiment of the present disclosure.

As shown in FIG. 19, an embodiment of the disclosure is a method 100 of manufacturing a semiconductor device, including an operation S110 of forming an underlying structure in a first area 85B and a second area 85A over a substrate 10. The underlying structure may include one or more insulating layers 15, 40, a conductive layer 30, or an etch stop layer 35. A first layer 45 is formed over the underlying structure in operation S120. The first layer 45 is removed from the second area 85A in operation S130. Next, a second layer 55 is formed over the first area 85B and the second area 85A in operation S140. The second layer 55 has a smaller light transparency (or higher extinction coefficient) than the first layer 45. Then, in operation S150, the second layer 55 is removed from the first area 85B. A first resist pattern 65b is subsequently formed over the first layer 45 in the first area 85B and a second resist pattern 65a is formed over the second layer 55 in the second area 85A in operation S160.

Figure 20:
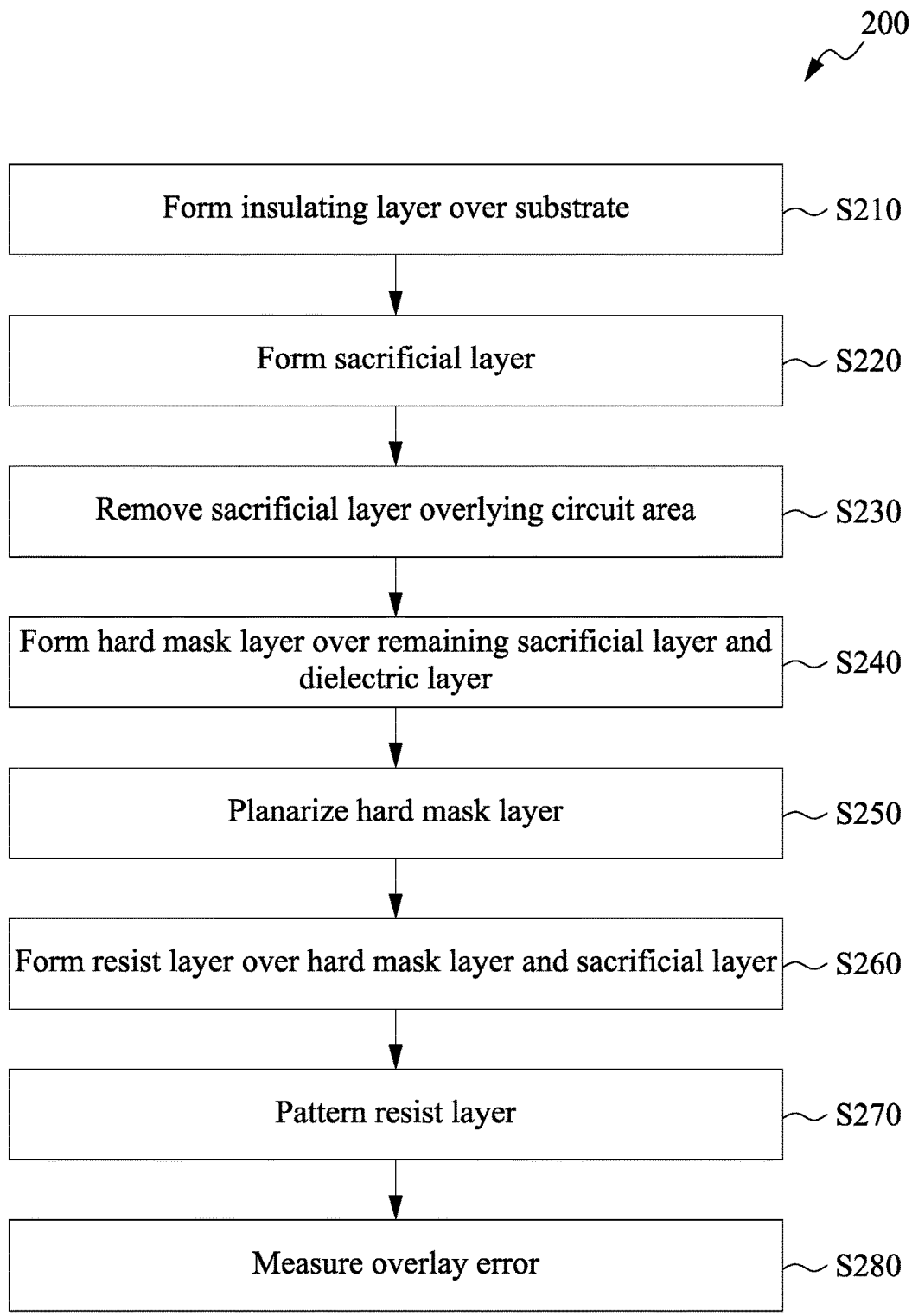
FIG. 20 shows a flowchart of a method of manufacturing a semiconductor device according to an embodiment of the present disclosure.

Another embodiment is a method 200 of manufacturing a semiconductor device, as shown in FIG. 20. The method 200 includes an operation S210 of forming an insulating layer 40 having a first thickness A over a substrate 10, wherein the substrate 10 has an overlay mark area 85B and a circuit area 85A. Then, in operation S220, a sacrificial layer 45 having a second thickness B is formed over the insulating layer 40. The sacrificial layer 45 is a made of a different material than the insulating layer 40, and a ratio of the second thickness B to the first thickness A ranges from 0.4 to 0.9. The sacrificial layer 45 overlying the circuit area 85A is removed in operation S230. A hard mask layer 55 having a third thickness C is subsequently formed over a remaining portion of the sacrificial layer 45 and the insulating layer 40 in operation S240. Next, the hard mask layer 55 is planarized in operation S250. Then, in operation S260, a resist layer 60 is formed over the hard mask layer 55 and the sacrificial layer 45, and the resist layer 60 is patterned in operation S270. In some embodiments, the overlay error between the underlying pattern and the resist pattern is measured in the overlay mark area 85B in operation S280 using an optical measurement tool.

Figure 21:
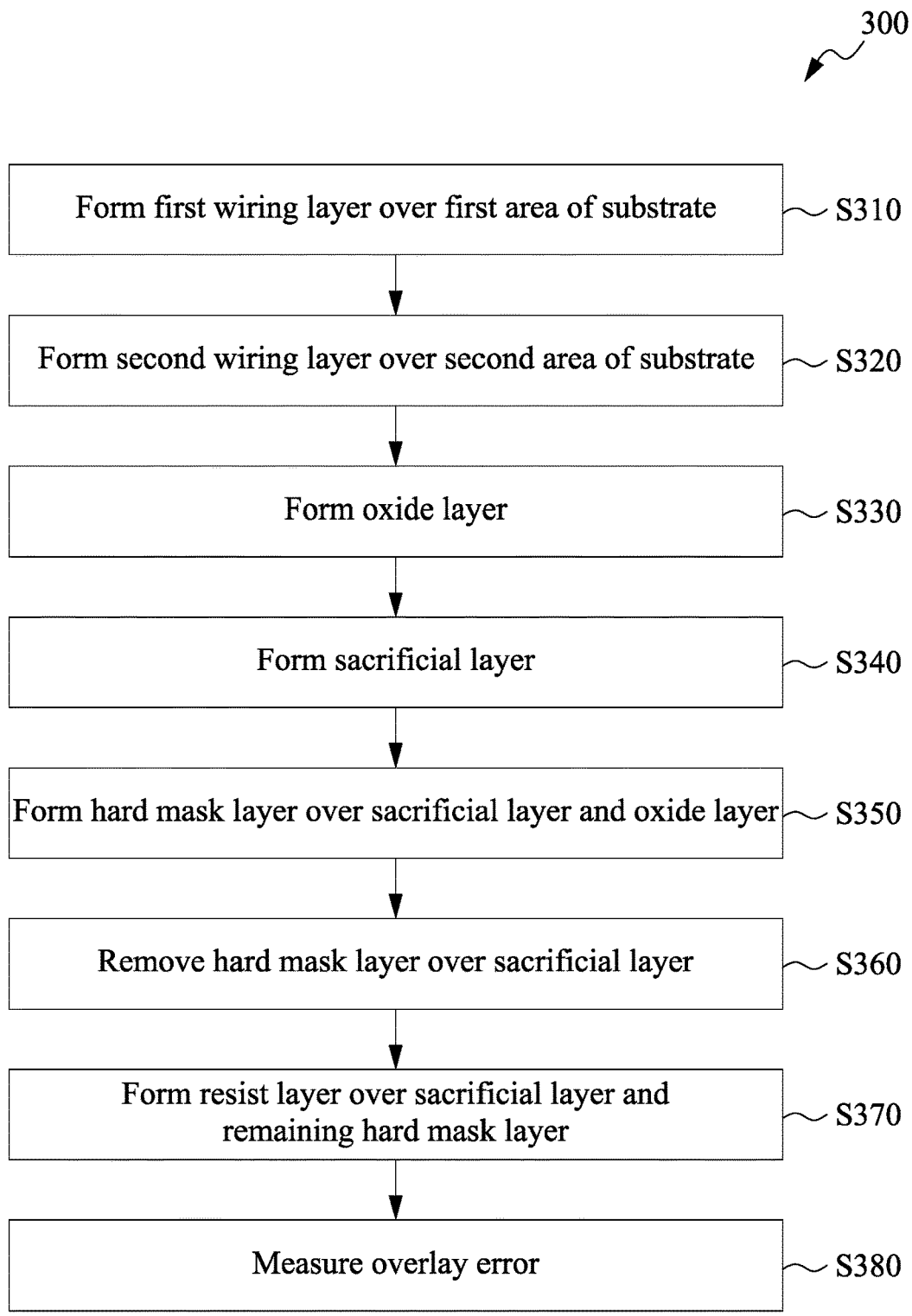
FIG. 21 shows a flowchart of a method of manufacturing a semiconductor device according to an embodiment of the present disclosure.

Another embodiment is a method 300 of manufacturing a semiconductor device, as shown in FIG. 21. The method 300 includes an operation S310 of forming a first wiring layer 15, 30 over a first area 85B of a substrate and forming a second wiring layer 15, 30 over a second area 85A of the substrate. Then, in operation S320, an oxide layer 40 having a first thickness A is formed over the first and second wiring layers 15, 30. A sacrificial layer 45 having a second thickness B is subsequently formed over the oxide layer 40 in operation S340. The sacrificial layer 45 only overlies the first area 85B of the substrate. The sacrificial layer 45 has a lower coefficient of extinction than the oxide layer 40. The ratio of the second thickness B to the first thickness A ranges from 0.4 to 0.9. Next, a hard mask layer 55 having a third thickness C is formed over the sacrificial layer 45 and the oxide layer 40 in operation S350. The hard mask layer 55 has a greater coefficient of extinction than the sacrificial layer 45. In operation S360, the hard mask layer 55 over the sacrificial layer 45 is removed. Then, a resist layer 60 is formed over the sacrificial layer 45 and the remaining portion of the hard mask layer 55 in operation S370. In some embodiments, the overlay error between the underlying pattern and the resist pattern is measured in the overlay mark area 85B in operation S280 using an optical measurement tool.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, and other memory cells are formed.

Embodiments of the disclosure provide improved resist patterning, and improved semiconductor devices with higher device yields. Embodiments of the disclosure provide substantially flat and even photoresist layers over device structures. Differences in the level of the top surface of a photoresist layer over circuit regions of a device structure and the level of the top surface of the photoresist layer in overlay mark regions are less than 0.5 µm in some embodiments and less 0.1 µm in other embodiments. The small difference in the photoresist layer levels provides improved and consistent focus across the device structure during photolithographic exposure to actinic radiation. The improved focus results in improved pattern feature resolution and line width roughness (LWR) of the patterned photoresist features. The improved resolution and LWR in turn provides improved resolution of device structure, and improved alignment of patterned device structures, thereby improving the device yield. Because no opaque hard mask layer is disposed below the resist pattern in the overlay mark region overlay error measurement is more accurately and correctly performed.

It will be understood that not all advantages have been necessarily discussed herein, no particular advantage is required for all embodiments or examples, and other embodiments or examples may offer different advantages.

According to an embodiment of the disclosure, a method of manufacturing a semiconductor device includes forming an underlying structure in a first area and a second area over a substrate. A first layer is formed over the underlying structure. The first layer is removed from the second area while protecting the first layer in the first area. A second layer is formed over the first area and the second area, wherein the second layer has a smaller light transparency than the first layer. The second layer is removed from the first area, and first resist pattern is formed over the first layer in the first area and a second resist pattern over the second layer in the second area. In an embodiment, the first resist pattern is located at a first vertical level and the second resist pattern is located at a second vertical level, and a difference between the first vertical level and the second vertical level is less than 0.5 µm. In an embodiment, the difference is less than 0.1 µm. In an embodiment, the first layer includes an insulating material. In an embodiment, the second layer includes a metal. In an embodiment, an overlay measurement pattern is disposed in the first area, and a circuit pattern is disposed in the second area. In an embodiment, a thickness of the second layer is equal to or greater than a thickness of the first layer. In an embodiment, the second layer is removed from the first area by a chemical mechanical polishing (CMP) operation. In an embodiment, in the CMP operation, a part of the second layer is removed from the second area. In an embodiment, a thickness of the second layer is smaller than a thickness of the first layer, the second layer is removed from the first area by a chemical mechanical polishing (CMP) operation, and in the CMP operation, a part of the first layer is removed from the first area.

Another embodiment of the present disclosure is a method of manufacturing a semiconductor device, including forming an insulating layer having a first thickness over a substrate, wherein the substrate has an overlay mark area and a circuit area. A sacrificial layer having a second thickness is formed over the insulating layer. The sacrificial layer is a made of a different material than the insulating layer, and a ratio of the second thickness to the first thickness ranges from 0.4 to 0.9. The sacrificial layer overlying the circuit area is removed. A hard mask layer having a third thickness is formed over a remaining portion of the sacrificial layer and the insulating layer. The hard mask layer is planarized. A resist layer is formed over the hard mask layer and the sacrificial layer, and the resist layer is patterned. In an embodiment, a ratio of the third thickness to the second thickness ranges from 0.3 to 4.2. In an embodiment, a ratio of the third thickness to the first thickness ranges from 0.5 to 0.85. In an embodiment, an upper surface of the resist layer is located at a first vertical level over the overlay mark area and is located at a second vertical level over the circuit area, and a difference between the first vertical level and the second vertical level is less than 0.5 µm. In an embodiment, the insulating layer and sacrificial layer are made of silicon oxide having different coefficients of extinction.

Another embodiment of the disclosure is a method of manufacturing a semiconductor device, including forming a first wiring layer over a first area of a substrate and forming a second wiring layer over a second area of the substrate. An oxide layer having a first thickness is formed over the first and second wiring layers. A sacrificial layer having a second thickness is formed over the oxide layer, wherein after the forming a sacrificial layer the sacrificial layer only overlies the second area of the substrate. The sacrificial layer has a lower coefficient of extinction than the oxide layer, and a ratio of the second thickness to the first thickness ranges from 0.4 to 0.9. A hard mask layer having a third thickness is formed over the sacrificial layer and the oxide layer. The hard mask layer has a greater coefficient of extinction than the sacrificial layer. The hard mask layer over the sacrificial layer is removed. A resist layer is formed over the sacrificial layer and remaining portion of the hard mask layer. In an embodiment, the resist layer is a tri-layer resist. In an embodiment, the insulating layer and sacrificial layer are made of silicon oxide having different coefficients of extinction. In an embodiment, the removing the hard mask over the sacrificial layer includes chemical mechanical polishing the hard mask layer. In an embodiment, an upper surface of the resist layer is located at a first vertical level over the first area and is located at a second vertical level over the second area, and a difference between the first vertical level and the second vertical level is less than 0.5 µm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming an underlying structure in a first area and a second area over a substrate;
   forming a first layer over the underlying structure;
   removing the first layer from the second area while protecting the first layer in the first area;
   forming a second layer over the first area and the second area, where the second layer has a smaller light transparency than the first layer;
   removing the second layer from the first area; and
   forming a first resist pattern over the first layer in the first area and a second resist pattern over the second layer in the second area,
   wherein a thickness of the second layer is smaller than a thickness of the first layer.

2. The method of claim 1, wherein the first resist pattern is located at a first vertical level and the second resist pattern is located at a second vertical level, and a difference between the first vertical level and the second vertical level is less than 0.5 µm.

3. The method of claim 2, wherein the difference is less than 0.1 µm.

4. The method of claim 1, wherein the first layer includes an insulating material.

5. The method of claim 1, wherein the second layer includes a metal.

6. The method of claim 1, wherein an overlay measurement pattern is disposed in the first area, and a circuit pattern is disposed in the second area.

7. The method of claim 1, wherein the second layer is removed from the first area by a chemical mechanical polishing (CMP) operation.

8. The method of claim 7, wherein in the CMP operation, a part of the second layer is removed from the second area.

9. A method of manufacturing a semiconductor device, comprising:
   forming an insulating layer having a first thickness over a substrate,
   wherein the substrate has an overlay mark area and a circuit area;
   forming a sacrificial layer having a second thickness over the insulating layer,
   wherein the sacrificial layer is a made of a different material than the insulating layer,
   wherein a ratio of the second thickness to the first thickness ranges from 0.4 to 0.9;
   removing the sacrificial layer overlying the circuit area;
   forming a hard mask layer having a third thickness over a remaining portion of the sacrificial layer and the insulating layer,
   wherein a ratio of the third thickness to the first thickness ranges from 0.5 to 0.85;
   planarizing the hard mask layer;
   forming a resist layer over the hard mask layer and the sacrificial layer; and
   patterning the resist layer.

10. The method according to claim 9, wherein a ratio of the third thickness to the second thickness ranges from 0.3 to 4.2.

11. The method of claim 9, wherein an upper surface of the resist layer is located at a first vertical level over the overlay mark area and is located at a second vertical level over the circuit area, and a difference between the first vertical level and the second vertical level is less than 0.5 µm.

12. The method of claim 9, wherein the insulating layer and sacrificial layer are made of silicon oxide having different coefficients of extinction.

13. A method of manufacturing a semiconductor device, comprising:
   forming a first wiring layer over a first area of a substrate;
   forming a second wiring layer over a second area of the substrate;
   forming an oxide layer having a first thickness over the first and second wiring layers;
   forming a sacrificial layer having a second thickness over the oxide layer, wherein after the forming a sacrificial layer, the sacrificial layer only overlies the second area of the substrate, wherein the sacrificial layer has a lower coefficient of extinction than the oxide layer, and wherein a ratio of the second thickness to the first thickness ranges from 0.4 to 0.9;
   forming a hard mask layer having a third thickness over the sacrificial layer and the oxide layer,
   wherein the hard mask layer has a greater coefficient of extinction than the sacrificial layer;
   removing the hard mask layer over the sacrificial layer; and
   forming a resist layer over the sacrificial layer and remaining portion of the hard mask layer.

14. The method according to claim 13, wherein the resist layer is a tri-layer resist.

15. The method according to claim 13, wherein the oxide layer and the sacrificial layer are made of silicon oxide having different coefficients of extinction.

16. The method according to claim 13, wherein the removing the hard mask over the sacrificial layer includes chemical mechanical polishing the hard mask layer.

17. The method of claim 13, wherein an upper surface of the resist layer is located at a first vertical level over the first area and is located at a second vertical level over the second area, and a difference between the first vertical level and the second vertical level is less than 0.5 μm.

18. The method of claim 9, wherein the hard mask layer is planarized by a chemical mechanical polishing (CMP) operation.

19. The method of claim 18, wherein in the CMP operation, a part of the sacrificial layer is removed.

20. The method of claim 9, wherein the hard mask layer includes a metal.

\* \* \* \* \*